United States Patent [19]

Newton, III

[11] 4,394,957

[45] Jul. 26, 1983

[54] SENSOR CONTROL DEVICE

[76] Inventor: John P. Newton, III, Box 55, Selkirk, N.Y. 12158

[21] Appl. No.: 245,724

[22] Filed: Mar. 20, 1981

[51] Int. Cl.³ .................... F24F 7/00; H03K 5/159
[52] U.S. Cl. ............................. 236/49; 236/46 F; 236/78 D; 307/252 B
[58] Field of Search ............... 236/49, 46 F, 1 EA, 236/78 D; 165/26; 307/252 B, 97; 219/501; 364/557, 505; 62/228 B, 215; 98/33 R

[56] References Cited

U.S. PATENT DOCUMENTS

| | | | |
|---|---|---|---|
| 3,426,969 | 2/1969 | Anderson, Jr. | 236/78 D |
| 3,844,475 | 10/1974 | Kesterson et al. | 236/1 EA |
| 4,078,393 | 3/1978 | Wills | 62/186 X |
| 4,270,693 | 1/1981 | Hayes | 236/46 F |
| 4,315,413 | 2/1982 | Baker | 62/186 X |

FOREIGN PATENT DOCUMENTS 2348328  3/1975  Fed. Rep. of Germany ... 236/78 D

Primary Examiner—William E. Wayner
Attorney, Agent, or Firm—Kane, Dalsimer, Kane, Sullivan & Kurucz

[57] ABSTRACT

A sensor control device for controlling the operation of a device such as an air blower, including a sensor capable of sensing a change in the environment from a predetermined level and providing a signal corresponding to the change and a logic means capable of receiving the signal and based upon this signal control the operation of the blower device in such a manner that its operation is in proportion to the change in the environment while inhibiting small changes from affecting the operation of the blower. The sensor device is particularly advantageous in controlling the amount of circulation provided by a blower device interposed between a thermal collector and a building so as to provide the circulation of thermal energy therebetween.

24 Claims, 4 Drawing Figures

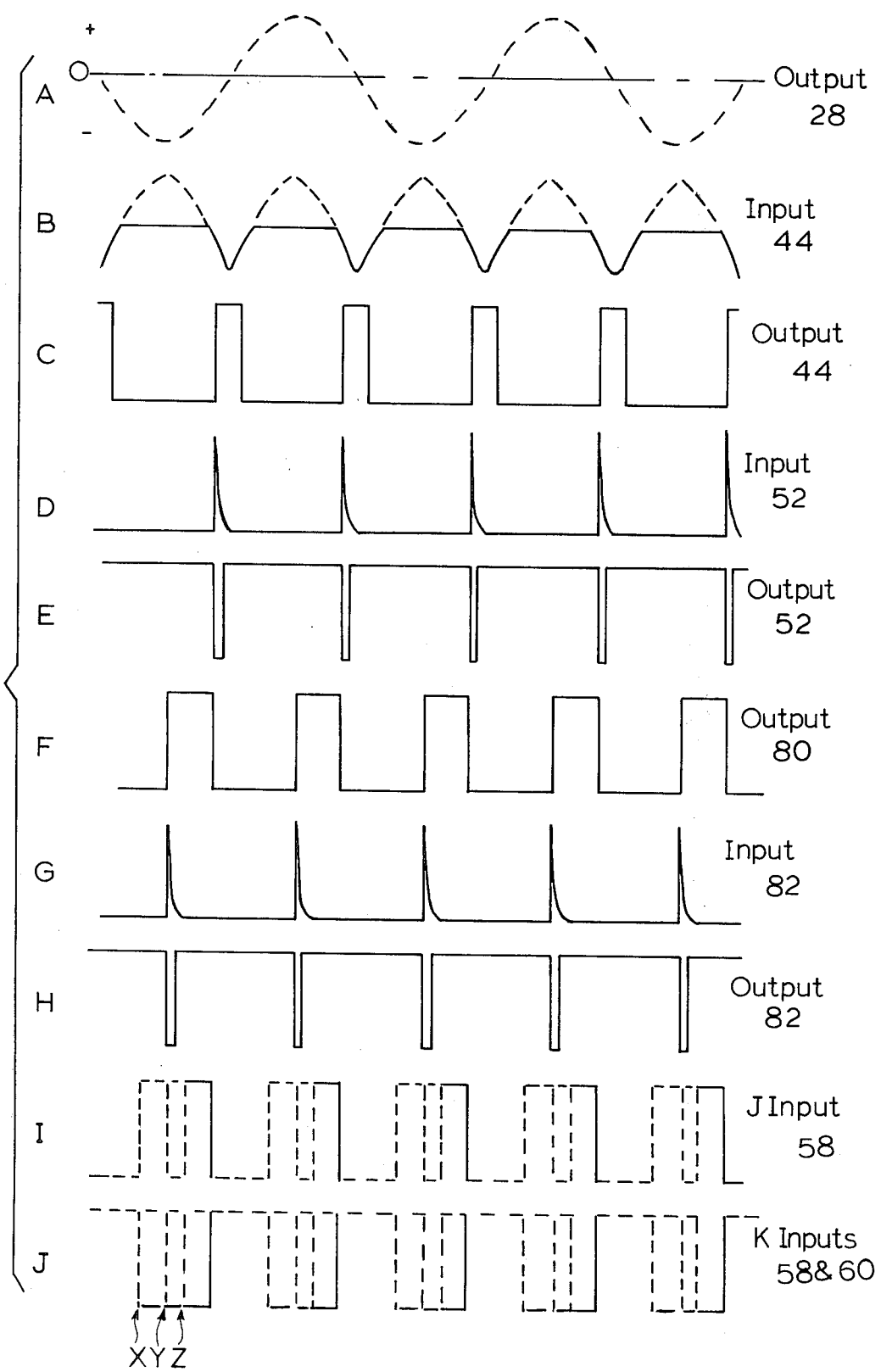

SENSOR CONTROL DEVICE

FIELD OF THE INVENTION

The present invention is directed towards providing a device which allows for control of an operative element such as a blower based upon accurate sensing of changes in a controlled environment.

BACKGROUND AND SUMMARY OF THE INVENTION

There exists many applications where the control of an operative element such as for example a blower, heater, light, pump, etc., is regulated by a change in a controlled situation or environment. An obvious example of this is in home heating and cooling whereby a thermostat is used to activate heaters and air conditioners at appropriate temperatures and deactivate them at others.

In certain applications the changes may be gradual or fast it is desirable to accurately and quickly detect such changes in the controlled environment and accordingly compensate for the change. In this regard, the sensor should be capable of detecting the change and accordingly signalling the operative element to perform the appropriate compensating function. However, the sensitivity to enable it to accurately detect such changes may result in rapid on-off oscillation about a cut off point or allow for noise to unduly influence the operation of the system.

Further, rather than compensate by merely signalling the operative element to go on or turn off at a set level, it is often desirable to have the operative element activated in a manner proportional to the change in the controlled environment, so as to conserve energy. Such a situation is that as shown in FIG. 4, which involves the use of a greenhouse to collect thermal energy for heating an attached building. To distribute the collected heat, a blower may be utilized to circulate the heat between the greenhouse and the building thereby decreasing its overall energy costs. If necessary to preserve plants or for other reasons desired, the heat in the building at night might be used to compensate for any cooling in the greenhouse taking place during that time. An accurate interrelation between the operation of the fan or blower and the level of thermal energy in the greenhouse would be advantageous in the effective use of such thermal energy in heating the building.

Accordingly, it is an object of the invention to provide a device which accurately senses the changes in a controlled environment and provides an output capable of controlling the activities of an operative element in proportion to the changes involved.

It is another object to provide for an accurate switching about a predetermined cutoff point of the operative element thereby preventing rapid on-off oscillations thereabout and to prevent noise from unduly affecting the operation of a system.

A further object is to provide for such a device to control a fan or blower capable of circulating the air in a greenhouse or other thermal collecting means so as to maintain a constant level of heat therein whereby as the temperature of the greenhouse changes, it is sensed by said device and the blower is activated to a degree proportional to the change in temperature so as to circulate the heated air and thus distribute the collected heat. In this regard, the blower speed increases as the temperature increases above the set point. This allows for: the greenhouse to be kept at the lowest practicable temperature during the day to minimize its heat loss; a low amount of energy to be expended in blower operation during periods of low solar gain; the use of a large capacity blower so that during periods of high energy gain, all of the energy may be realized while preventing overcooling or rapid cycling during average and below average days; increasing the overall system efficiency by the lowered temperatures, increased blower capacity, and decreased power usage by the blower. In addition, an advantage in this particular application is the fact that with a lower blower speed, the noise resulting from the blower is greatly reduced.

BRIEF DESCRIPTION OF THE DRAWINGS

The above mentioned and other features and objects of this invention will become more apparent by reference to the following description which is to be taken in conjunction with the drawings.

FIG. 2A-2J depicts waveforms at various connections of the circuit depicted in FIG. 1 during the circuit's operation;

DETAILED DESCRIPTION OF THE PREFERRED EMBODIMENT

Figure 1:
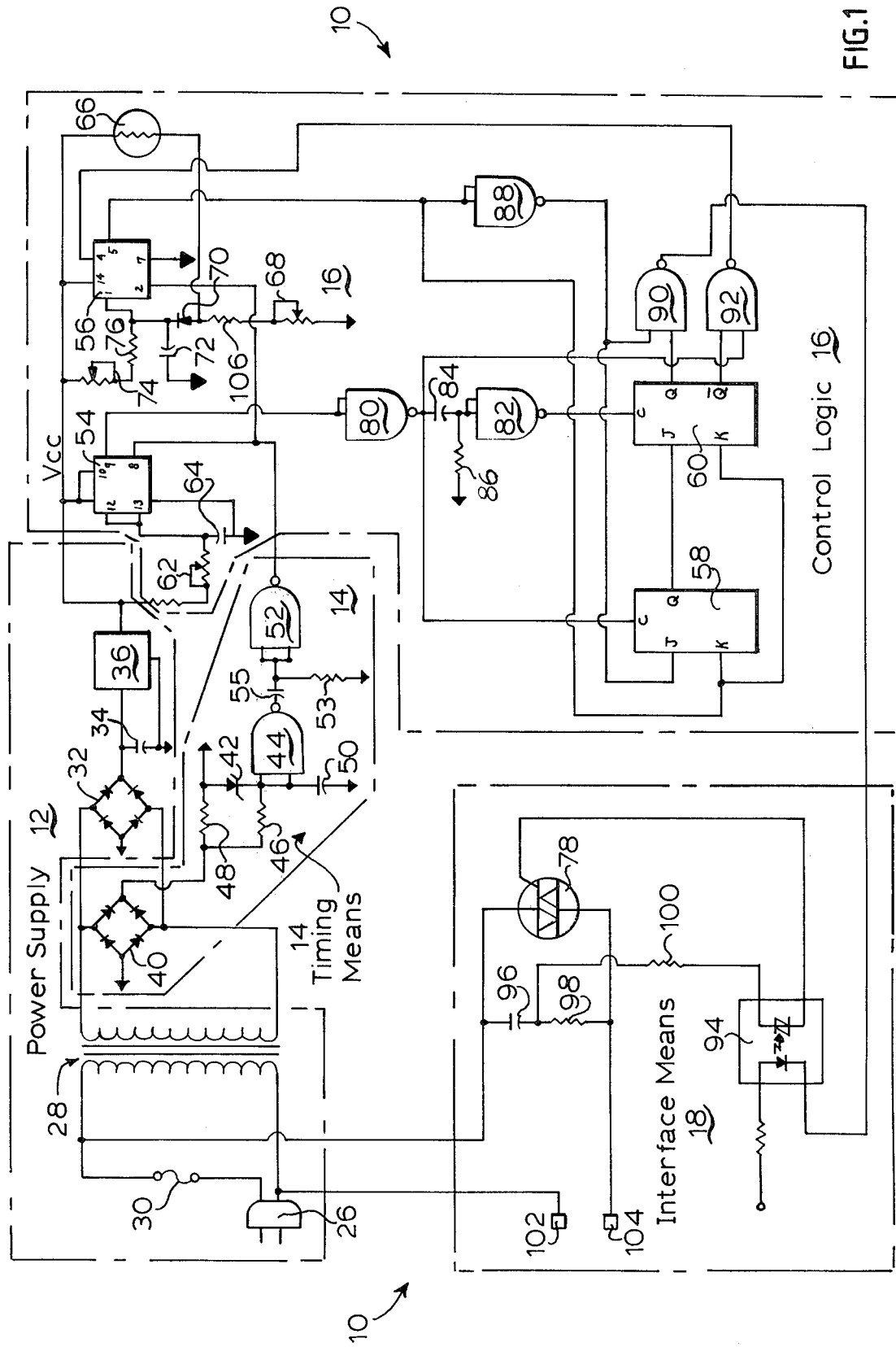
FIG. 1 is a schematic representation of the sensor circuit of the sensor device incorporating the teachings of the present invention.
Figure 4:
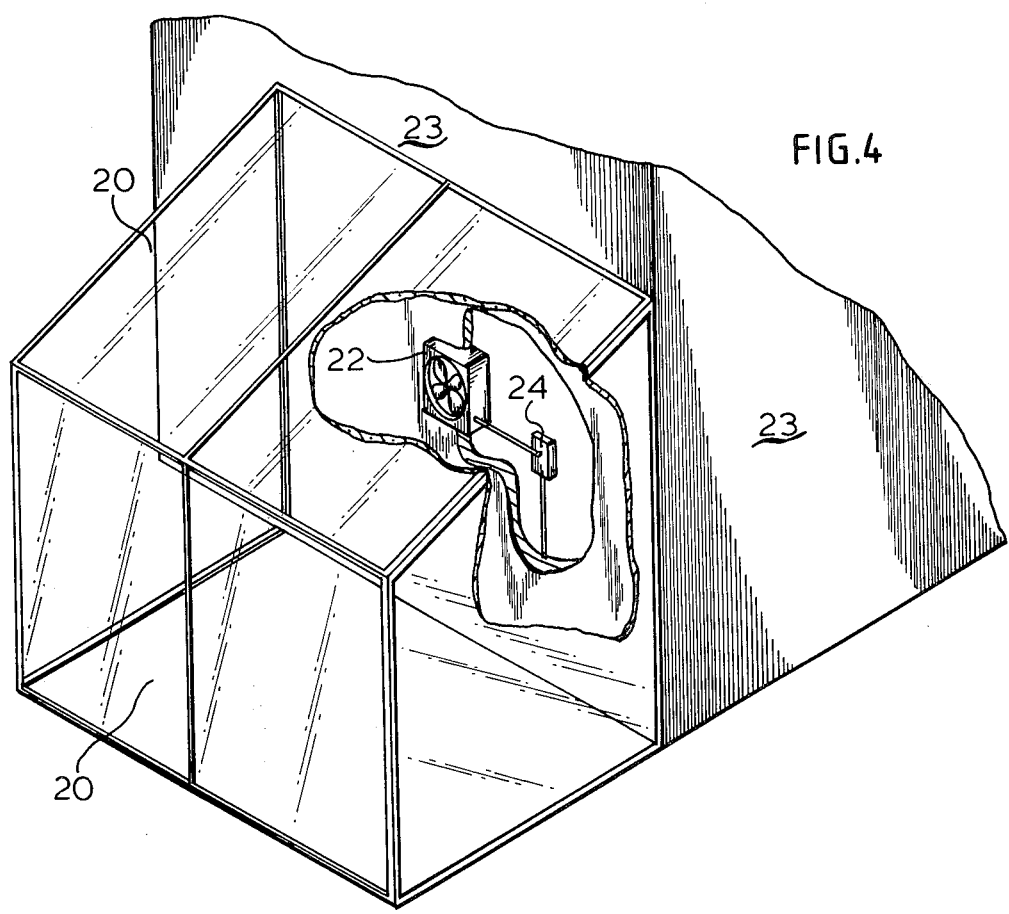
FIG. 4 is a somewhat sectional view of a greenhouse in conjunction with a building with a blower therebetween controlled by the sensor device incorporating the teachings of the present invention.

With regard now particularly to the figures, FIG. 1 schematically depicts the sensor or controller device which embodies a circuit 10 which as outlined on the diagram has been broken down into a number of sections including a power supply 12, timing means 14, control logic 16, and interface means 18, each of which will be discussed in detail. For illustrative purposes herein, and as will be referred to in connection with the discussion of the operation of the controller circuit 10, this circuit serves to sense changes in a controlled environment such as in the greenhouse 20 shown in FIG. 4, and to regulate the operation of a blower 22 between the greenhouse 20 and connected building 23, as will later be discussed. The controller circuit 10 may be maintained in a panel 24, as shown, and connected to a power source via plug 26 shown in FIG. 1.

Turning to the particular sections of the control circuit 10, the power supply to it may be as illustrated or any other means suitable for purposes. As shown it utilizes standard 120 volt AC coupled to a primary of a transformer 28 via plug 26, with fuse 30 providing short circuit protection thereof. The output of the seondary of the transformer 28 (see FIG. 2A) is rectified by diode bridge 32, filtered by capacitor 34 and regulated by regulator 36, whose output serves to provide a power supply (Vcc) for the control logic 16.

The transformer 28 output is also separately rectified by a diode bridge 40 and regulated by zener diode 42, providing an input (FIG. 2B) to nand gate 44 (preferably Schmitt type) via current limiting resistor 46. The circuit further includes a loading resistor 48 and by-pass capacitor 50.

The output of gate 44 (FIG. 2C) is coupled with nand gate 52 (preferably Schmitt type) via resistor 53 and capacitor 55 which initially suppresses the input to gate 52. As the output from gate 44 goes high, the input to gate 52 goes high for the RC time constant established by the resistor 53 and capacitor 55, providing a narrow inverted output pulse (FIG. 2E) for the length of the time the differentiated input pulse remains above the trigger value of the gate 52.

This trigger pulse is used to sychronize the control logic 16 with successive power line cycles with the negative going edge of this trigger pulse corresponding to a point slightly before the beginning of each half power line cycle. (See FIG. 2A and 2E).

Coupled with the output of gate 52 are two monostable multivibrators 54 and 56, which may be a single unit generally designated in the industry as a "556 Timer", and two JK flip-flops 58 and 60. While these have been illustrated as separate units, if so desired they may be fabricated as a single integrated circuit chip. The multivibrators 54 and 56 are simultaneously triggered by the trigger pulse output of gate 52 and begin their timing delays. Potentiometer 62 in combination with capacitor 64 determines the pulse width of the output of the multivibrator 54, and the component values for these elements are chosen so as to allow the pulse to terminate before the beginning of each power line cycle or prior to arrival of the next trigger pulse. The output of multivibrator 54 provides a reference point synchronized with a desired amount of phase shift into each half power line cycle which will form the basis of a "cutoff" level which may be adjusted by adjusting potentiometer 62 so as to vary the "cutoff" level as desired, as will become later apparent.

Multivibrator 56 also incorporates pulse width determining circuitry so as to increase its sensitivity, that being the more change in pulse width for a given change in resistance, with that resistance being provided by a thermistor 66. It should be noted that while a thermistor is being used for illustrative purposes, it is readily apparent to those skilled in the art that other types of sensors may be utilized in its place, i.e., photocell, humidity sensor, etc., depending upon the particular application. By increased sensitivity, small changes in the control environment cause thermistor 66 to effect relatively large changes in the amount of power directed to the blower 22 connecting to the controller circuit.

In this regard, the thermistor 66 used has a negative temperature coefficient of resistivity such that the resistance in the thermistor decreases as temperature increases, and vice versa. Coupled with the thermistor 66, is potentiometer 68 thereby forming a voltage divider circuit and accordingly the voltage at the diode 70 would vary directly as a function of the change in temperature due to the change in resistance of thermistor 66. In operation, multivibrator 56 by internal circuitry shorts capacitor 72 prior to receiving a trigger pulse from gate 52. After being triggered, capacitor 72 is released and charges at a rapid rate to the voltage divider level through diode 70. The potentiometer 74 and resistor 76 are connected between Vcc and capacitor 72 and serves as a sensitivity circuit and aids in charging. However the RC constant of this circuit is longer than that of the voltage divider and capacitor 72 arrangement due to the resistance of resistor 76 which is chosen so that regardless of the setting of the potentiometer 74, the time constant of the sensitivity circuit is longer than that of the voltage divider circuit. Once the capacitor has charged to the level of the voltage divider, the diode 70 cuts off. The capacitor 72 continues to charge towards the level of Vcc through the sensitivity circuit of potentiometer 74 and resistor 76. This rate of charge as aforenoted is less than the rate of charge of the capacitor through the diode 70 by the voltage divider circuit. When capacitor 72 is charged to ⅔ Vcc, the pulse output of multivibrator 56 ends and the multivibrator waits for the next trigger pulse from gate 52.

As is clear, the higher the temperature at the thermistor 66, the lower its resistance and for giving settings of potentiometers 74 and 68, the shorter the duration of the output pulse of multivibrator 56 since the rate of charge of the capacitor 72 increases. Conversely, as the temperature decreases at the thermistor 66, its increased resistance produces an opposite result, increasing the duration of the output pulse.

Also, with set values of potentiometer 74 and the thermistor 66, the resistance of potentiometer 68 may be adjusted to regulate the duration of the output of the multivibrator 56 by varying the rate of charging of capacitor 72. Increased resistance would increase the rate of change and shorten the output pulse duration and vice versa. Similarly, for set values of thermistor 66 and potentiometer 68, the duration of the output pulse from multivibrator 56 would vary with the resistance of potentiometer 74 by influencing the rate of charging of the capacitor 72 when diode 70 cuts off. Accordingly, the potentiometer 68 may be used to provide a set point adjustment to allow for a desired pulse width at the output of multivibrator 56 for a given temperature sense at the thermistor 66. Potentiometer 74 serves as a sensitivity control means since it adjusts the rate of charge of the capacitor 72 from a point at which diode 70 cuts off until ⅔ Vcc is reached and the output pulse terminates. If the resistance of potentiometer 74 is great, then this rate of charge would be slow resulting in small changes in temperature being reflected as relatively large changes in pulse width at the output of the multivibrator 56. If the value of the potentiometer 74 is relatively small, this allows for the rate of charge of capacitor 72 after diode 70 cuts off to be greatly increased so that a small change in temperature will not produce a great difference in pulse width. As will be apparent, this sensitivity advantageously allowing for detection of small changes in temperature.

The output pulse of the multivibrator 56 is used to control the phase shift firing of the triac device 78 of the interface means 18 as illustrated herein. The remaining elements of the control logic 16 determine whether or not the signal from the multivibrator 56 will be allowed to reach the interface means. In this regard, in order for this signal to reach the interface means, its output pulse width must be of shorter duration than the output pulse width of multivibrator 54 which is adjustable as aforementioned to provide a desired "cutoff" level.

More specifically, the output of multivibrator 54 is inverted by nand gate 80 (FIG. 2F) whose output connects to the input of nand gate 82 (both gates 80 and 82 are preferably Schmitt type) via the capacitor 84, resistor 86 network, which provide a low to high transition in the output from gate 80 to be differentiated and applied to gate 82. (See FIG. 2G).

A negative going pulse now exists at the output of gate 82 in synchronism with the low to high transition of its input. (See FIGS. 2G and 2H). This pulse is then applied to the clock input of the flip-flop 60. Since the flip-flops are clocked only by low to high transition, flip-flop 58 will be clocked slightly before flip-flop 60. This delay in clocking is equal to the width of the narrow pulse output of gate 82 as shown in FIG. 2H.

The output of multivibrator 56 is applied to the K inputs of both flip-flops 58 and 60 with nand gate 88 serving as an invertor. The output of gate 88 is applied to the J input of flip-flop 58 and the driving nand gate 90. Upon completion of the output pulses from multivibrator 54, a low to high transition takes place in the output of gate 80 which clocks the flip-flop 58 updating the status of its output according to typical truth table operation of JK flip-flops. Accordingly, if the pulse width output of the multivibrator 56 is shorter than that of the reference multivibrator 54 as in the case where the temperature is increasing and the resistivity of the thermistor 66 decreases, then J will be high and K will be low at the time of clocking flip-flop 58. This will place a high at the Q output of flip-flop 58 which is applied to the J input of flip-flop 60 with K still low and upon clocking establishes a high level Q output at flip-flop 60. This high Q output is connected to an input of gate 90 enabling it to pass the inversion of the signal placed on its other input which would be that from multivibrator 56 via gate 88.

Accordingly, with a high level Q output of flip-flop 60 placed upon an input of gate 90 the signal from the phase shift determining multivibrator 56 is thereupon allowed to pass to the interface means 18.

Further, as the thermistor 66 cools, the pulse width output of multivibrator 56 will become longer. The reference multivibrator 54 output however remains the same. As the pulse width of the output of multivibrator 56 increases, a point is reached at the instance of clocking flip-flop 58, when the J input is at a low level (the inverted longer pulse) and its K input is at a high level. This transfers a low level to the Q output of flip-flop 58 and onto the J input of flip-flop 60. Whereupon clocking, flip-flop 60 would output a low signal to gate 90. If for example clocking of flip-flop 60 occurs a short period thereafter when the level on its K input has gone low, the pulse width output of multivibrator 56 is long enough so that the K input of flip-flop 58 is high during clocking but not long enough to keep the K input of flip-flop 60 also high, during its clocking. In such a situation, according to the truth table operation of JK flip-flops, a J low and K low inputs at the clocking of flip-flop 60 will keep its Q output the same as it was before clocking. Continuing from my earlier discussion, in such a situation its output remains high and gate 90 would continue to pass a signal to the interfacing means. FIGS. 2I and 2J depict respectively the pulse inputs to the J input of flip-flop 58 and the K inputs of both flip-flop 58 and 60 with X designating the pulse when the temperature is above a predetermined cutoff; Y designates when a temperature that causes a pulse to be in the middle of the hysteresis pulse; and Z designating the pulse at a temperature below the cutoff.

It can be seen that small fluctuations in temperature which may cause the Q output of flip-flop 58 to oscillate between a high and low level will not be reflected as an oscillation in the gating of the interface means. In order for the Q output of flip-flop 60 to change levels, the output multivibrator 56 must change by at least the width of the pulse leaving the output of gate 82. When this happens, the J input of flip-flop 60 will be at a low level and the K input will be at a high level. Upon clocking the Q output would be low causing gate 90 to output a high level regardless of the signal coming from multivibrator 56. This high level will inhibit the interface means 18 from firing the triac 78.

As the temperature at the thermistor 66 increases, the pulse width output of multivibrator 56 decreases. In order for the Q output of flip-flop 60 to return to a high level, the pulse width output of multivibrator 56 must decrease. After the level at the K input of flip-flop 60 returns to a low during clocking, it is necessary for the pulse width output of multivibrator 56 to further decrease by at least the width of the pulse leaving gate 82. This will allow the Q output of flip-flop 58 to return to a high, placing a high on the J input of flip-flop 60. This in turn will cause the output Q of flip-flop 60 to go high allowing gate 90 to pass a gating signal to the interface means 18.

The nand gate 92 has one of its inputs connected to the output of gate 80 and its other input connected to the $\bar{Q}$ output of flip-flop 60. When the $\bar{Q}$ output of flip-flop is high and the gating signal is allowed to pass, the Q output is low. This causes gate 92 to output a high level regardless of the signal at its other input. The output of gate 92 is connected to the reset pin (4) of multivibrator 56. A high signal on this pin allows the multivibrator 56 to function normally, whereas a low on this pin causes the output of the multivibrator to go low and remain there as long as the reset pin remains low. When the Q output of flip-flop 60 goes low, interface gating is inhibited and the $\bar{Q}$ output goes high. This allows the inverted signal coming from multivibrator 54 to dynamically reset multivibrator 56, each half power line cycle. Since multivibrator 56 is still dynamic after its signal to the interface means is cutoff, the above reset circuitry insures its pulse width output terminates before another trigger from timing means 14 arrives regardless of any further decrease in temperature. Multivibrator 56 remains dynamic so that recovery from the cutoff mode can take place.

What is clear from the foregoing is that the circuit provides for extremely rapid switching with no indecisiveness at the cutoff point and incorporates a digital hysteresis system which prevents small temperature fluctuations about the cutoff point from causing rapid on-off oscillations. In addition, the circuit provides excellent noise immunity since decisions pertaining to cutoff status require only a few microseconds to finalize and are updated only twice during each powerline cycle. The output of flip-flop 60 is locked to a level after clocking and it can only be changed during a subsequent clock pulse if the aforenoted conditions permit. Further, only noise gliches which occur precisely during the microsecond rise time of the clock pulse could be of any significance in determining the status of the flip-flop and in any event errors which might occur are immediately corrected during the next clocking cycle.

In addition, such a circuit elminates the need for shielded sensor wires by having the sensor in a low impedance RC network indirectly determining the cutoff point, rather than in a high impedance comparator circuit as is often used by analog circuitry for directly determining the cutoff point, adding to the simplicity and effectiveness of the circuit.

Turning now to the interface means 18 illustrated in FIG. 1, this includes a triac 78 which is driven by a triac driver 94 which consists of a light emitting diode and photo sensitive bilateral switch. When a high signal is supplied to the LED, it is reverse biased and does not emit light and the bilateral switch is in a non-conductive state. When a low signal is applied to the LED, it is forward biased and emits light, causing the bilateral switch to conduct. This in turn allows a trigger voltage from the junction of capacitor 96 and resistor 98, via resistor 100, to be supplied to the gate of the triac 78 causing it to conduct, providing a closed circuit from the power supply via the plug 26 to the terminals of the output 102 and 104 which in turn would be connected to the blower 22. As is evident, the control logic 16 utilizing the sensor 66 will determine the period of conduction during each power line cycle and thus the amount of power received by the blower connected to the output terminals 102 and 104. Also, the use of the triac driver 94 allows the high voltage triac circuitry to be isolated from the other low voltage parts of the circuitry so as to insure against possible circuit damage and personal hazard.

It should be noted that while the interface means has been depicted as a triac 78 and triac driver 94, it should be understood and apparent to those skilled in the art that other interface means suitable for purpose may be readily utilized in the system.

Figure 3:
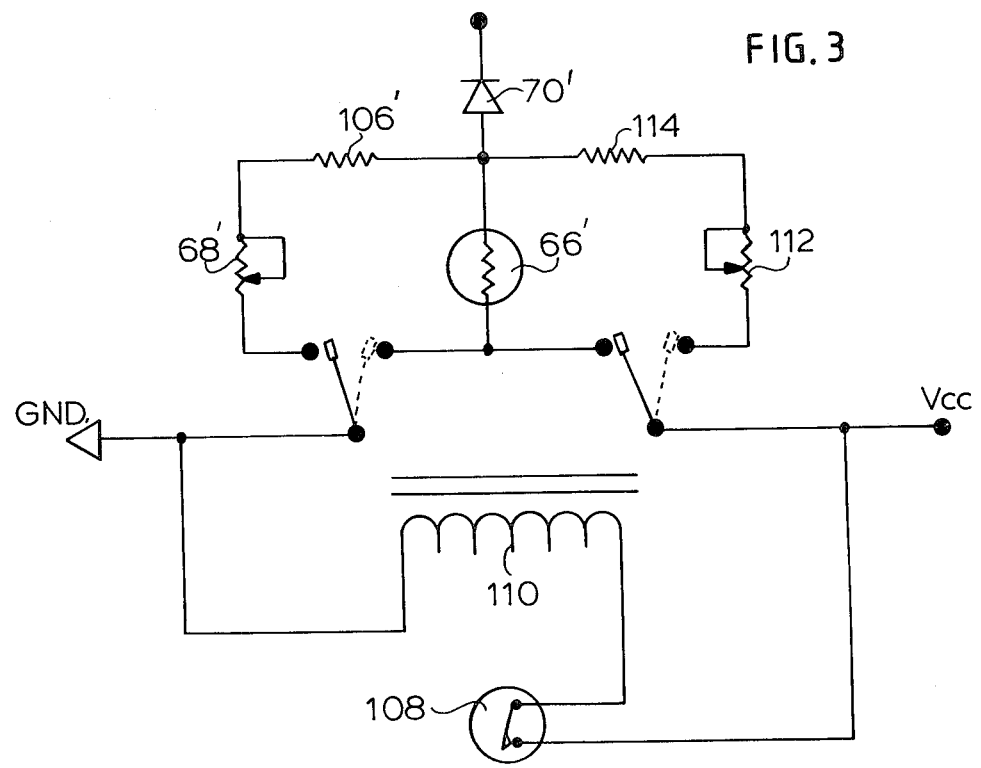
FIG. 3 is a schematic representation of a circuit capable of modifying the operation of the circuit in FIG. 1, so that a change in the intensity of a sensed parameter in either direction about a set point will effect a proportional increase in the amount of power received by an operative device connected to the output of the circuit.

As can be seen in FIG. 3, the circuitry depicted in FIG. 1 may be readily modified to allow for both a forward and reverse control operation. Hereafter conditions of a sensed parameter which are above a set point (i.e., the setting of potentiometer 68) will be designated as the forward mode and conditions of a sensed parameter below the set point will be designated as the reverse mode. It will become apparent (upon further disclosure) that the rotational-direction of a reversing motor may be configured to correspond with the above modes. In this regard, the diode 70, limiting resistor 106, potentiometer 68 and thermistor 66 are replaced by the elements shown in FIG. 3 with however corresponding parts similarly numbered but designated with a prime. The sensor now consists of thermistor 66' and a snap sensor switch 108. Sensor switch 108 may be adjusted to close at a desired temperature i.e, 70°.

As the temperature decreases in the controlled environment, cutoff of the device takes place in the same manner as previously described with regard to FIG. 1. However, as the temperature continues to decrease below the cutoff point as established by the parameters of the control logic circuitry, at 70° set point the sensor switch switches to open. This deenergizes relay 110 causing its contacts to connect Vcc to potentiometer 112 and disconnect potentiometer 68' from the circuit which effectively inverts the position of the sensor 66' in the voltage divider network. The potentiometer 112 which now replaces potentiometer 68' in the network, allows for an independent set point adjustment for operation to occur in the reversing mode via current limiting resistor 114.

As the temperature further decreases, the voltage at diode 70' now increases, opposite to that previously discussed with regard to FIG. 1. This decrease in temperature will now cause the output of the multivibrator 56 to decrease its output pulse width eventually reaching the turn on point of the control logic, with the setting of resistor 112 determining the point at which the reversing operation would take place. In this regard, a further decrease in temperature would allow more power to be sent to the blower 22. The circuitry would function in the same manner as previously described since it is receiving the same changes in voltage at diode 70' during the reversing mode since the sensing of the thermistor 66 is reversed. Implementation of this with a blower can be affected by interchanging the directional-rotation determining leads of a reversable motor by the use of additional relay contacts, the direction of rotation of the blower 22 as well as the speed of rotation can be controlled as a function of temperature as aforementioned.

An example of a typical schedule for forward and reverse operation may be as follows, for forward rotation the set point at which the blower would first operate would be between 60°–90°. For example, this may be set at 80° F. with full speed realized at approximately 90° F. For reverse rotation, the blower may turn on at 60° F., with full speed of the blower realized at 50° F. A deadband of 20° is utilized at which time the blower would be in a non-function state. In such a period, the sensor switch 108 changes the position of the contacts of relay 110 at 70° with the sensor circuit in the cutoff band during switching between either mode. Therefore switching the position of the thermistor during this cutoff period would cause not interruption of the motor operation of the blower.

In addition to the aforenoted, a minimum blower speed, i.e., the slowest motor speed before cutoff, adjustable from perhaps 10% blower volume to 50% blower volume is desirable to alloy the controller to be used with any blower motor, adjustable via potentiometer 62. This minimum speed acts as a failsafe to insure that the blower does not draw current under stall conditions or when insufficient air passes over its motor to dissipate its internal heat.

An advantage application for the controller circuit as described herein would be its use in a solar greenhouse 20 perhaps attached to the side (south) of a heated structure or building 23. When the sun heats the air inside the greenhouse during daylight hours, the sensor circuit 110 contained in a panel 24 would have its sensor exposed to the atmosphere in the greenhouse. Above a certain temperature (i.e., 80° F.) would cause the blower to circulate the warm air from the greenhouse into the structure as an energy saving means.

During the night when the greenhouse cools below a certain temperature at which it is necessary to maintain perhaps plants, etc., the reversing mode of the controller circuit would come into play and could be utilized to move heat from the building into the greenhouse to maintain its minimum temperature. In any event, the blower would be signalled only to turn as fast as it is necessary to maintain the optimum heat transfer.

Of course, the present device is suitable for other applications besides the aforementioned and while a preferred embodiment of the invention has been disclosed and described in detail herein, it should be understood that it is not limited thereby, rather its scope is to be determined by that of the appended claims.

What is claimed is:

1. A control circuit adapted to be coupled with a power source for providing an output capable of controlling the operation of a device such as a blower, with said circuits output being a function of a change in a controlled environment from a predetermined level, comprising:
   sensor means capable of sensing a change in the environment and providing a signal corresponding to said change;

logic means capable of receiving said signal and providing an output for controlling the operation of the device, said logic means includes: first generating means capable of generating periodically a reference pulse of predetermined pulse width; second generating means capable of generating a pulse having a width that varies as a function of the signal corresponding to the change from the predetemined level; and means capable of determining the difference in width of said pulses and based upon said difference gate or inhibit the output of the control circuit so that the output is proportional to the change in the environment with small changes from the predetermined level inhibited from causing undesired oscillation of the output about said level.

2. The circuit in accordance with claim 1 which further includes a timing means capable of providing a trigger pulse to sychronize the operation of the first and second generating means.

3. The circuit in accordance with claim 2 wherein said timing means is adapted to be coupled with a rectified AC power source and provides said trigger pulse during half power cycles of said source.

4. The circuit in accordance with any one of claims 1 or 2 wherein said means capable of determining the difference in width of said pulses includes; a first and second JK flip-flop, the first flip-flop being clocked by the refernece pulse and having the pulse from the second generating means applied to its input, the output of said first flip-flop upon clocking being applied to the input of the second flip-flop with the pulse of the second generating means applied to its other input, said second flip-flop being clocked by the reference pulse after a predetermined delay; said first flip-flop being capable of determining if there is a difference between the width of the reference pulse and the width of the pulse from the second generating means and if so provides an output to the second flip-flop signifying a difference; said second flip-flop is clocked after a predetermined delay and is capable of providing an output based upon the output of the first flip-flop and the width of the pulse of the second generating means which either inhibits or gates the output of the control circuit; and wherein said predetermined delay prevents small changes in the width of the pulse from the second generating means from causing undesirable oscillation of the output of the controlled circuit.

5. The circuit in accordance with claim 4 wherein the output of the control circuit is a pulse from the second generating means which is inhibited or gated by the second flip-flop.

6. The circuit in accordance with claim 5 wherein the power source is cyclic and said circuit further includes a reset means capable of resetting second generating means each half power cycle of the source so that said second generating means provides a separate pulse output during each of said cycles.

7. The circuit in accordance with claim 6 which further includes an interface means coupled to the output of the control circuit and adapted to be coupled with the device.

8. The circuit in accordance with claim 7 wherein the interface means is a triac whose period of conductance regulates the operation of the device with said period of conductance being a function of the control circuit output.

9. In combination with the circuit in accordance with claim 7, a device such as a blower capable of operating in either a forward or reverse mode and said control circuit includes a means capable of selecting the mode and controlling the operation of the device when in a particular mode.

10. The combination in accordance with claim 9 which includes a blower device capable of circulating air at a variable rate in each mode, said predetermined level is a temperature leval and said control circuit is coupled with the blower with said blower's operation controlled by the output of the control circuit such that a change in the rate of circulation is proportional to a change in temperature from the predetermined level.

11. The combination in accordance with claim 10 which includes a thermal collector and a contained environment; said sensor being exposed to the thermal energy collected by said collector; said blower being disposed between said collector and contained environment so as to be able to circulate air therebetween at a rate proportional to the change in temperature of the thermal energy from the predetermined level.

12. The circuit in accordance with claim 1 which includes a means of adjusting the pulse width of the first generating means so as to be able to change the predetermined level.

13. The circuit in accordance with claim 12 which includes a means of adjusting the pulse width of the second generating means so as to be able to limit or increase the effect of the signal from the sensor means thereon.

14. The circuit in accordance with claim 13 wherein said second generating means is a multivibrator (MV) having an input and an output, and is capable of generating a pulse on its output the width of which is determined by the delay between a triggering of the MV and applying a predetermined potential to its input.

15. The circuit in accordance with claim 14 which includes a voltage divider and sensitivity circuit coupled with said sensor means and the input of said MV; capacitor means coupled with the input of the MV and capable of being charged by said voltage divider and sensitivity circuit; said capacitor being capable of providing said delay based upon a rate of its charging by the voltage divider and sensitivity circuit; wherein the sensor means operates to influence the rate of charge of the capacitor means by changing the resistance in the voltage divider, the extent of which is dependent upon the amount of change in the environment from the predetermined level with said sensitivity circuit capable of adjusting the amount of influence the sensor means has on the rate of charge of the capacitor means.

16. The circuit in accordance with claim 15 wherein said sensor means is a thermistor whose resistance changes with a change in temperature of the environment thereby sensing said change; the thermistor and resistance means comprise said voltage divider whereby the change in resistance of the thermistor causes a change in the rate charge of the capacitor coupled thereto during operation of the device thereby signalling a corresponding change in the environment.

17. The circuit in accordance with any one of claims 1–16 which further includes an interface means coupled to the output of the control circuit and adapted to be coupled with the device.

18. The circuit in accordance with claim 17 wherein the interface means is a triac whose period of conductance regulates the operation of the device with said period of conductance being a function of the control circuit output.

19. In combination with the circuit in accordance with claim 17, a device such as a blower capable of operating in either a forward or a reverse mode and its control circuit includes a means capable of selecting the mode and controlling the operation of the device when in a particular mode.

20. The combination in accordance with claim 19 which includes a blower device capable of circulating air at a variable rate in each mode, said predetermined level is a temperature level and said control circuit is coupled with the blower with said blower's operation controlled by the output of the control circuit such that a change in the rate of circulation of air caused by the blower is proportional to a change in temperature from the predetermined level.

21. The combination in accordance with claim 20 which includes a thermal collector and a building, said sensor being exposed to the thermal energy collected by said collector, said blower being disposed between said collector and said building so as to be able to circulate air therebetween at a rate proportional to the change in the temperature in the thermal energy from the predetermined level.

22. An environmental sensor control system comprising:
a device such as a blower capable of operating in either a forward or a reverse mode;
interface means coupled with the device;
a control circuit adapted to be coupled between said interface means and a power source, said control circuit providing an output capable of controlling the operation of the device with said output being a function of a change in a controlled environment from a predetermined level;
said control circuit comprising: sensor means capable of sensing a change in the environment and providing a signal corresponding to said change; logic means capable of receiving said signal and providing an output for controlling the operation of the device, said logic means output being operationally coupled to the device and proportional to the change in the environment so as to cause a corresponding proportional change in the operation of the device while being capable of inhibiting small changes from the predetermined level from causing undesired oscillation of the output about said level; and means capable of selecting a mode and controlling the operation of the device when in a particular mode.

23. The combination in accordance with claim 22 which includes a blower device capable of circulating air at a variable rate in each mode, said predetermined level is a temperature level and said control circuit is coupled with the blower with said blower's operation controlled by the output of the control circuit such that a change in the rate of circulation of air caused by the blower is proportional to a change in temperature from the predetermined level.

24. The combination in accordance with claim 23 which includes a thermal collector and a contained environment; said sensor being exposed to the thermal energy collected by said collector; said blower being disposed between said collector and contained environment so as to be able to circulate air therebetween at a rate proportional to the change in temperature of the thermal energy from the predetermined level.

* * * * *